United States Patent
Abe (10) Patent No.: US 6,643,826 B2
(45) Date of Patent: Nov. 4, 2003

(54) SEMICONDUCTOR CIRCUIT CONNECTION DATA BASE AND METHOD OF DESIGNING SEMICONDUCTOR CIRCUIT USING THE DATA BASE

(75) Inventor: Shinichi Abe, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/986,266

(22) Filed: Nov. 8, 2001

(65) Prior Publication Data

US 2002/0104060 A1 Aug. 1, 2002

(30) Foreign Application Priority Data

Jan. 30, 2001 (JP) ........................................ 2001-021953

(51) Int. Cl.[7] .............................................. G06F 17/50
(52) U.S. Cl. ................................ 716/1; 716/5; 716/11; 716/10; 716/9
(58) Field of Search ..................................... 716/1, 2–21

(56) References Cited

U.S. PATENT DOCUMENTS

| | | | | |
|---|---|---|---|---|
| 5,164,908 A | | 11/1992 | Igarashi ...................... 364/491 |
| 5,856,925 A | * | 1/1999 | Maeda et al. ................... 716/5 |
| 6,099,581 A | * | 8/2000 | Sakai ........................... 716/11 |
| 6,167,556 A | * | 12/2000 | Sun et al. ...................... 716/3 |
| 2001/0038612 A1 | * | 11/2001 | Vaughn et al. .............. 370/256 |

FOREIGN PATENT DOCUMENTS

| | | | | |
|---|---|---|---|---|
| JP | 6-168291 | 6/1994 | ........... G06F/15/60 |
| JP | 7-97378 | 10/1995 | ........... G06F/15/60 |
| JP | 7-334562 | 12/1995 | ........... G06F/17/60 |
| JP | 9-147006 | 6/1997 | ........... G06F/17/50 |
| JP | 2000-123064 | 4/2000 | ........... G06F/17/50 |

* cited by examiner

Primary Examiner—Vuthe Siek
Assistant Examiner—Magid Y Dimyan
(74) Attorney, Agent, or Firm—McDermott, Will & Emery (57) ABSTRACT

The present invention provides a semiconductor circuit connection data base expressing a relation of connection between functional blocks forming an internal circuit of a semiconductor device, wherein the relation of connection between functional blocks is described by a form of a table on which a functional block on the output side and a name of a terminal on the output side, and a functional block on the input side and a name of a terminal on the input side are made into a set of row data, without using a name of a net.

7 Claims, 6 Drawing Sheets

| SOURCE | | | DESTINATION | | | |
|---|---|---|---|---|---|---|
| MODULE | INSTANCE | PIN | MODULE | INSTANCE | PIN | |
| PAD | PAD | PINA | PAD1 | PI1 | IN | |
| PAD | PAD | PINB | PAD2 | PI2 | IN | ← 12 |
| PAD3 | PI3 | OUT | PAD | PAD | POUTA | ← C1 |
| PAD4 | PI4 | OUT | PAD | PAD | POUTB | ← C2 |
| PAD1 | PI1 | OUT | BLKA | BISA | AI1 | |
| PAD2 | PI2 | OUT | BLKA | BISA | AI2 | |
| BLKC | BISC | CO1 | PAD3 | PI3 | IN | |
| BLKC | BISC | CO2 | PAD4 | PI4 | IN | |
| BLKA | BISA | AO1 | BLKC | BISC | CI1 | |
| BLKA | BISA | AO2 | BLKC | BISC | CI2 | |
| BLKB | BISB | BO1 | BLKA | BISA | AI3 | |
| BLKC | BISC | CO3 | BLKB | BISB | BI1 | ← 13 |
| PAD | PAD | TEST1 | PAD5 | PI5 | IN | ← C3 |
| PAD | PAD | TEST2 | PAD6 | PI6 | IN | ← C4 |
| PAD5 | PI5 | OUT | TMDBLK | TMDBLK | TI1 | ← C5 |
| PAD6 | PI6 | OUT | TMDBLK | TMDBLK | TI2 | ← C6 |

Columns: R1 (MODULE), R2 (INSTANCE), R3 (PIN), R4 (MODULE), R5 (INSTANCE), R6 (PIN)

| SOURCE | | | DESTINATION | | | |
|---|---|---|---|---|---|---|
| MODULE | INSTANCE | PIN | MODULE | INSTANCE | PIN | |
| FIX | FIX | 1 | BLKE | BISE | EI1 | ← C7 |
| FIX | FIX | 0 | BLKE | BISE | EI2 | ← C8 |
| BLKE | BISE | EO1 | OPEN | OPEN | OPEN | ← C9 |

| SOURCE | | | DESTINATION | | | |
|---|---|---|---|---|---|---|
| MODULE ↓R1 | INSTANCE ↓R2 | PIN ↓R3 | MODULE ↓R4 | INSTANCE ↓R5 | PIN ↓R6 | |
| PAD | PAD | PINA | PAD1 | PI1 | IN | |
| PAD | PAD | PINB | PAD2 | PI2 | IN | |
| PAD3 | PI3 | OUT | PAD | PAD | POUTA | |
| PAD4 | PI4 | OUT | PAD | PAD | POUTB | |
| PAD1 | PI1 | OUT | BLKA | BISA | AI1 | |
| PAD2 | PI2 | OUT | BLKA | BISA | AI2 | 55 |
| BLKC | BISC | CO1 | PAD3 | PI3 | IN | |
| BLKC | BISC | CO2 | PAD4 | PI4 | IN | ← C10 |
| | | | | | | 56 |
| BLKC | BISC | CO2 | ISOUT | ISOUT | MISC_CO2_NM | ← C11 |
| BLKB | BISB | BO1 | ISOUT | ISOUT | MISC_CO2_BM | ← C12 |
| ISOUT | ISOUT | MISC_CO2_ISOUT | PAD4 | PI4 | IN | ← C13 |
| BLKA | BISA | AO1 | BLKC | BISC | CI1 | |
| BLKA | BISA | AO2 | BLKC | BISC | CI2 | 57 |
| BLKB | BISB | BO1 | BLKA | BISA | AI3 | |
| BLKC | BISC | CO3 | BLKB | BISB | BI1 | ← C14 |
| | | | | | | 58 |
| BLKC | BISC | CO3 | BMISO | BMISO | PI2_OUT_NM | ← C15 |
| PAD2 | PI2 | OUT | BMISO | BMISO | PI2_OUT_BM | ← C16 |
| BMISO | BMISO | PI2_OUT_ISOUT | BLKB | BISB | BI1 | ← C17 |
| PAD | PAD | TEST1 | PAD5 | PI5 | IN | |
| PAD | PAD | TEST2 | PAD6 | PI6 | IN | 13 |
| PAD5 | PI5 | OUT | TMDBLK | TMDBLK | TI1 | |
| PAD6 | PI6 | OUT | TMDBLK | TMDBLK | TI2 | |
| | | | | | | 59 |
| TMDBLK | TMDBLK | BM | BMISO | BMISO | BM | ← C18 |
| TMDBLK | TMDBLK | BM | ISOUT | ISOUT | BM | ← C19 |

US 6,643,826 B2

SEMICONDUCTOR CIRCUIT CONNECTION DATA BASE AND METHOD OF DESIGNING SEMICONDUCTOR CIRCUIT USING THE DATA BASE

BACKGROUND OF THE INVENTION

The present invention relates to a semiconductor circuit connection data base expressing a relation of connection between functional blocks composing an internal circuit of a semiconductor device. Also, the present invention relates to a method of designing a semiconductor circuit using the semiconductor circuit connection data base.

Concerning the data base expressing a relation of connection between functional blocks forming an internal circuit of a conventional semiconductor device, the mainstream is a data base in which a net list is directly described with HDL (Hardware Description Language). In the HDL net list, the connection between functional blocks can be expressed by describing the same net name in the terminal name of one functional block and the terminal name of the another functional block. A change in the circuit according to a change in the specification and a work for inserting a test circuit are usually conducted on this HDL net list.

However, according to the above conventional method, when the connection between the functional blocks is visually checked on the HDL net list, it is necessary to search the entire net list for the net name so as to find a terminal in which the same net name is described so that the relation of connection between the terminals can be confirmed.

When the correction of wiring to connect the functional blocks is corrected or another functional block is inserted for correction, it is necessary to define a new net name, which does not overlap other net names, by dividing the net. When the correction is made manually, the correction work is complicated, and errors tend to occur. Further, it is difficult to efficiently check after that.

SUMMARY OF THE INVENTION

The present invention has been accomplished to solve the above problems. It is an object of the present invention to provide a semiconductor circuit connection data base expressing a relation of connection between functional blocks forming an internal circuit of a semiconductor device, wherein the relation of connection can be easily grasped and the change in the design can be easily made without causing complicated problems.

The present invention provides a semiconductor circuit connection data base expressing a relation of connection between functional blocks (4, 5, 6: 8, 9) forming an internal circuit (1:7) of a semiconductor device, wherein the relation of connection between the functional blocks (4, 5, 6: 8, 9) is described by a form of a table on which a functional block (module/instance) on the output side (Source) and a name (pin) of a terminal on the output side (Source), and a functional block (module/instance) on the output side and a name (Pin) of a terminal on the input side (Source) are made into a set of row data (C1 to C6), without using a name of a net.

According to the semiconductor circuit connection data base, the output section of the functional block and the input section of the corresponding functional block are described in one set of row data on the data base which is expressed by a table form. Therefore, the relation of the connection can be easily grasped, and it is unnecessary that a description is made at one position for each instance of the functional block, which is unlike the HDL description. Accordingly, the data base can be flexibly processed. Further, the data base can be easily processed in the case of correction to automatize.

Since the net name is not used in the case of designing the semiconductor circuit connection data base, even when the wiring is corrected or another functional block is inserted for correction with respect to the connection between the functional blocks, it is unnecessary to newly define a net name which does not overlap other net names. Accordingly, the change in the design can be easily made without causing complicated problems.

Preferably, the present invention provides a semiconductor circuit connection data base, in which the terminal of the functional block, described by the functional block on the input side and the name of the terminal on the input side, is a terminal of "0"-fixation or "1"-fixation at the logical level when the functional block on the output side and/or the name of the terminal on the output side is a specific identifier.

Moreover, the present invention described provides a semiconductor circuit connection data base, in which the terminal of the functional block, described by the functional block on the output side and the name of the terminal on the output side, is a terminal in an open state when the functional block on the input side and/or the name of the terminal on the input side is a specific identifier.

Further, the present invention provides a semiconductor circuit connection data base, in which the terminal described by the terminal name on the input side is expressed to be an output terminal to the outside of the semiconductor device when the functional block on the input side is made to be a specific identifier.

Furthermore, the present invention provides a semiconductor circuit connection data base, in which the terminal described by the terminal name on the output side is expressed to be an input terminal from the outside of the semiconductor device when the functional block on the output side is made to be a specific identifier.

Further, the present invention described provides a semiconductor circuit connection data base, in which when a terminal expressed to be an input terminal from the outside of a semiconductor device in one row data by the data base and a terminal expressed to be an output terminal to the outside of the semiconductor device in the other row data by the data base are of the same terminal name, it is expressed that the terminal having the same terminal name is a bidirectional terminal of input and output with respect to the outside of the semiconductor device.

According to the semiconductor circuit connection data base, expressions of "0"-fixation or "1"-fixation at the logical level of the input terminal, an open state of the output terminal and a specific connection state such as a connection to the outer terminal are previously determined as identifiers, and the functional block on the output side and/or the terminal name on the output side or the functional block on the input side and/or the terminal name on the input side is described as a specific identifier. Due to the foregoing, these specific connection states can be described by the same form as that of the normal connection relation between the functional blocks. Further, the processing related to the specific connection relation can be automatically performed by the specific identifier.

The present invention provides a method of designing a semiconductor circuit using a semiconductor circuit connection data base, wherein the semiconductor circuit connection data base is automatically corrected by a data base correction program using a design correction command file when a design correction for correcting a relation of connection between functional blocks is made.

According to the method of designing a semiconductor circuit, the connection relation can be easily grasped by the semiconductor circuit connection data base of a table form. Therefore, the correction of design can be easily described.

By using a design correction command file describing it, the semiconductor circuit connection data base can be automatically corrected by the data base correction programming. Therefore, the occurrence of mistakes caused by manual work can be prevented, and the efficiency of the design correction work can be enhanced.

The present invention provides a method of designing a semiconductor circuit using a semiconductor circuit connection data base, wherein a net name is automatically given by the HDL conversion program so that the HDL net list is created according to the functional block on the output side and the terminal name on the output side and also according to the functional block on the input side and the terminal name on the input side.

According to the method of designing a semiconductor circuit, since the semiconductor circuit connection data base of a table form has sufficient information of the connection relation although the net name is not used. Therefore, it is possible to make an HDL conversion program for creating an HDL net list by giving a net name automatically. When this HDL conversion program is used, the occurrence of mistakes caused by manual work can be prevented, and the efficiency of the design correction work can be enhanced.

DETAILED DESCRIPTION OF THE PREFERRED EMBODIMENT

Figure 1:
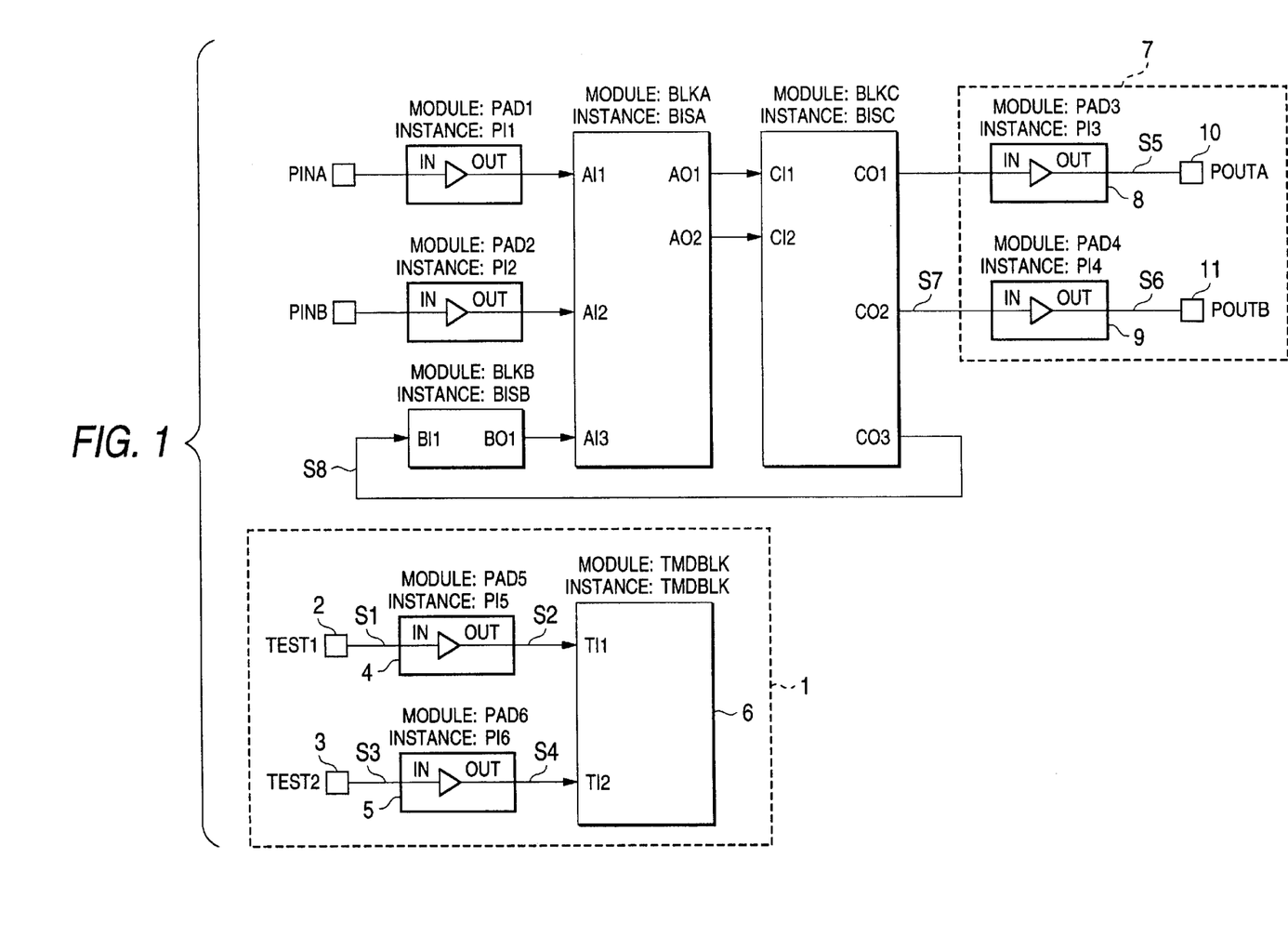
FIG. 1 is a view showing a circuit for explaining a semiconductor circuit connection data base of an embodiment of the present invention.
Figure 2:
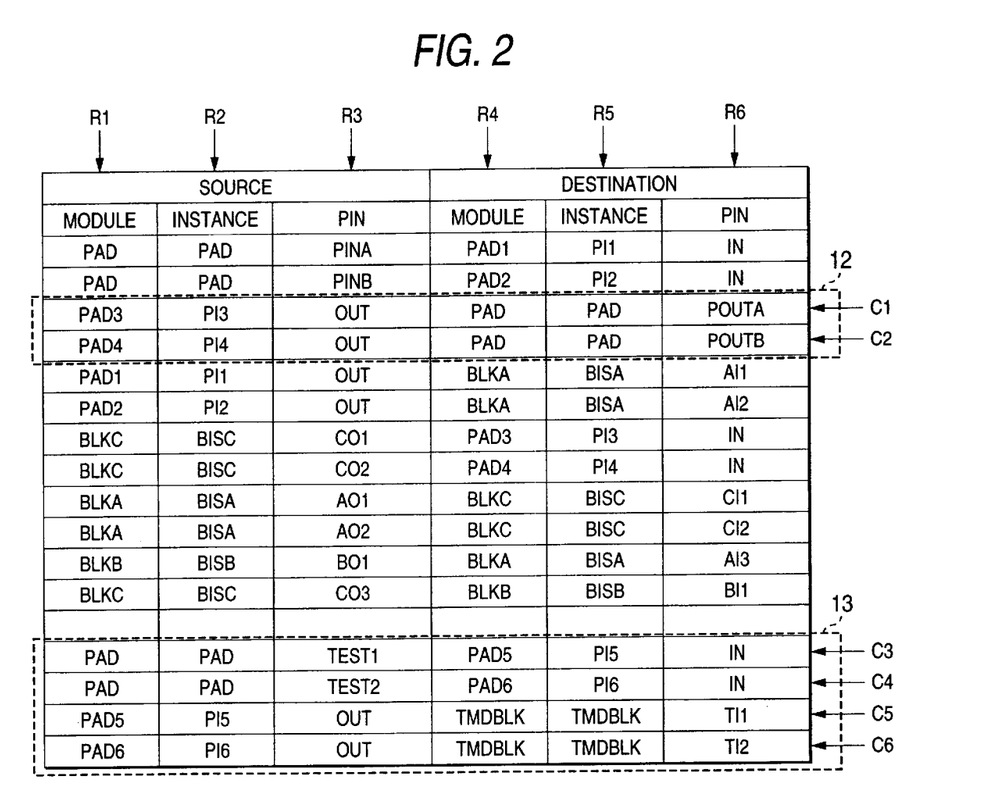
FIG. 2 is a view showing a semiconductor circuit connection data base of an embodiment of the present invention.

Referring to the drawings, an embodiment of the present invention will be explained below. FIG. 1 is a circuit diagram for explaining a semiconductor circuit connection data base relating to the present invention. FIG. 2 is a view showing a semiconductor circuit connection data base in which the connection relation between the functional blocks forming the circuit shown in FIG. 1 is expressed by a table form.

In FIG. 2, R1 to R6 are columns of the semiconductor circuit connection data base of the present invention. Rows R1, R2 and R3 respectively represent a module name, an instance name and a terminal name of the functional block on the output side. Rows R4, R5 and R6 respectively represent a module name, an instance name and a terminal name of the functional block on the input side.

Concerning the connection of one set of the functional blocks in the semiconductor circuit, when these six parameters are described as one set of row data, a connection relation can be defined without using a net name, wherein the output is a terminal described in column R3 of the functional block of the module described in column R1 and having the instance name described in column R2, and the input is a terminal described in column R6 of the functional block of the module described in column R4 and having the instance name described in column R5.

An arrangement of the semiconductor circuit data base of a table form will be explained with an example which is partially picked up from the circuit shown in FIG. 1. A portion of the circuit shown as the range 1 in FIG. 1 corresponds to the portion 13 in FIG. 2. In the range 1, each of the reference numerals 2 and 3 is an input terminal of the semiconductor device into which a signal is inputted from the outside. Names of the terminals are respectively "TEST1" and "TEST2". Reference numerals 4 and 5 are input pad cells respectively having an input terminal "IN" and an output terminal "OUT", the module names of which are respectively "PAD5" and "PAD6", the instance name of which are respectively "PI5" and "PI6". Reference numeral 6 is a functional block having the input terminals "TI1" and "TI2", the module names and the instance names of which are "TMDBLK".

The input terminal 2 is connected to terminal "IN" of input pad cell 4 by net S1. Output terminal "OUT" of the input pad cell 4 is connected to input terminal "TI1" of the functional block 6 by net S2. The input terminal 3 is connected to input terminal "IN" of the pad cell 5 by net S3. Output terminal "OUT" of the input pad cell 5 is connected to input terminal "TI2" of the functional block 6 by a net S4.

Portion 13 shown in FIG. 2, which is expressed on the semiconductor circuit connection data base of a table form of the present invention, corresponds to a portion of the circuit shown by the range 1 in FIG. 1. The connection of net S1 is defined by row C3 in FIG. 2. Rows R1 and R2 corresponding to the module name and the instance name on the output side of row C3 are defined as "PAD". "PAD" is an identifier representing the external terminal in the semiconductor device. When this is described in the module name and the instance name on the output side, that is, when this is described in columns R1 and R2, the terminal name described in column R3 represents an input terminal in the semiconductor device into which a signal is inputted from the outside. In the same manner, the connection of net S3 is defined by row C4.

The connection of net S2 in FIG. 1 is a connection of output terminal "OUT" of the input pad cell 4 with input terminal "TI1" of the functional block 6. This is defined by row C5 in FIG. 2. The connection of net S4 in FIG. 1 is a connection of output terminal "OUT" of the input pad cell 5 with input terminal "TI2" of the functional block 6. This is defined by row C6 in FIG. 2.

The circuit portion shown by the range 7 in FIG. 1 corresponds to the portion 12 in FIG. 2. In the range 7, reference numerals 10, 11 are output terminals of the semiconductor device from which signals are outputted outside. The terminal names are respectively "POUTA" and "POUTB". Reference numerals 8, 9 are output pad cells, and each output cell has an input terminal "IN" and an output terminal "OUT". The respective module names of the output pad cells are "PAD3" and "PAD4", and the respective instance names are "PI3" and "PI4". Output terminal "OUT" of the output pad cell 8 is connected with the output terminal 10 by net name S5. Output terminal "OUT" of the output pad cell 9 is connected with the output terminal 11 by net name S6.

Portion 12 shown in FIG. 2, which is expressed on the semiconductor circuit connection data base of a table form of the present invention, corresponds to a portion of the circuit shown by the range 7 in FIG. 1. The connection of net S5 is defined by row C1 in FIG. 2. Rows R4 and R5 corresponding to the module name and the instance name on the input side of row C1 are defined as "PAD". "PAD" is an identifier representing the external terminal in the semiconductor device. When this is described in the module name and the instance name on the input side, that is, when this is described in columns R4 and R5, the terminal name described in column R6 represents an output terminal in the semiconductor device from which a signal is outputted to the outside. In the same manner, the connection of net S6 is defined by row C2.

As described above, since one set of connection relations between the functional blocks are expressed by one set of row data, there is no concept that the terminals of the functional blocks are connected via the net name like the HDL net list. Therefore, the connection state can be easily grasped. The declaration of the external terminal or the definition of the input and output can be expressed by describing identifier "PAD" on the module name and the instance name. Therefore, the data base can be formed without causing any complicated problems.

Figure 3:
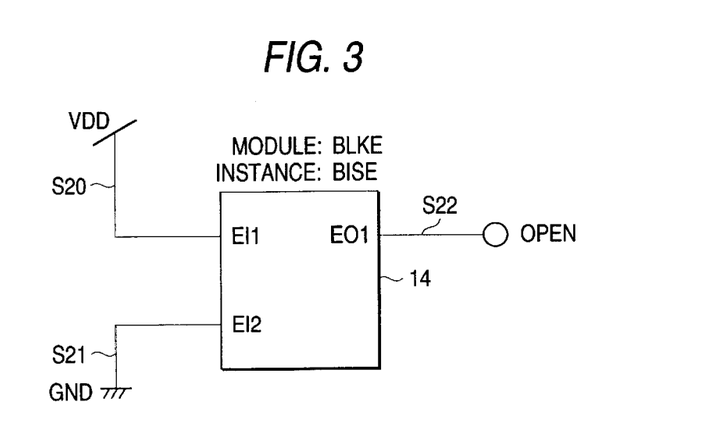
FIG. 3 is a view showing a circuit in a special connection state in a semiconductor circuit connection data base of an embodiment of the present invention.
Figure 4:
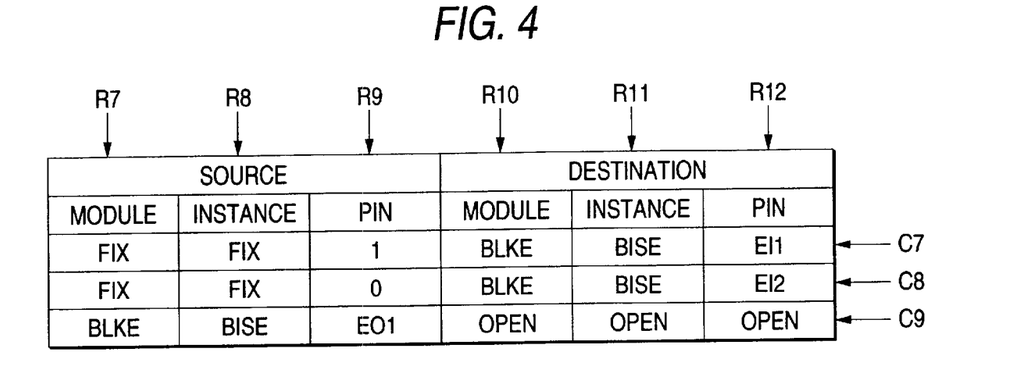
FIG. 4 is a view showing a semiconductor circuit connection data base of an embodiment of the present invention.

FIGS. 3 and 4 are views showing a describing method by which the input terminal of the functional block is made to be "0"-fixation at the logical level or "1"-fixation at the logical level in the semiconductor circuit connection data base of an embodiment of the present invention and also showing a describing method by which the output terminal of the functional block is made to be in an open state. FIG. 3 is a view showing a circuit for explaining a semiconductor circuit connection data base. FIG. 4 is a view showing a semiconductor circuit connection data base in which the connection relation between the functional blocks forming the circuit shown in FIG. 3 is expressed by a table form.

In FIG. 3, reference numeral 14 is a functional block, the module name of which is "BLKE" and the instance name of which is "BISE", having the input terminals, the names of which are "EI1" and "EI2" and also having the output terminal, the name of which is "EO1". Input terminal "EI1" of the functional block 14 is fixed at the logical level "1", and the input terminal "EI2" is fixed to the logical level "0". Output terminal "EO1" of the functional block 14 is not connected to other functional blocks but it is kept in an open state.

FIG. 4 is a view in which the circuit shown in FIG. 3 is expressed by the connection data base in a table form of the present invention. FIG. 4 is a view made by the same table form as that of FIG. 2. Rows R7, R8 and R9 respectively express the module name, instance name and terminal name of the functional block on the output side. Rows R10, R11 and R12 respectively express the module name, instance name and terminal name of the functional block on the input side.

The connection of net S20 in FIG. 3 is defined by row C7 in FIG. 4. There is a description of "FIX" in columns R7 and R8 expressing the module name and the instance name on the output side of row C7, and also there is a description of "1" in column R9 showing the terminal name. "FIX" is an identifier expressing "0"-fixation at the logical level or "1"-fixation at the logical level. When "FIX" is described in the module name and the instance name on the output side, that is, when "FIX" is described in columns R7 and R8, and "1" is described in column R9 expressing the terminal name, it is shown that the terminals of the input side module name "BLKE", the instance name "BISE" and the terminal name "EI1", which are described in columns R10, R11 and R12 in the same row, are fixed at the logical level "1".

In the same manner, the connection of net S21 is defined by row C8 in FIG. 4. There is a description of "FIX" in columns R7 and R8 expressing the module name and the instance name on the output side of row C8, and there is a description of "0" in column R9 showing the terminal name. Due to the foregoing, it is shown that the terminals of the input side module name "BLKE", the instance name "BISE" and the terminal name "EI2", which are described in columns R10, R11 and R12 in the same row, are fixed at the logical level "0".

The state of net S22 in FIG. 3 is defined by row C9 in FIG. 4. "Open" is described in all the module name, the instance name and the terminal name on the input side in row C9. "Open" is an identifier expressing an open state. When "Open" is described in all the module name, the instance name and the terminal name on the input side, it is shown that the terminals of the output side module name "BLKE", the instance name "BISE" and the terminal name "EO1", which are described in columns R7, R8 and R9 in the same row, are not connected to other functional blocks but they are kept in an open state.

When the predetermined identifiers such as "FIX", "OPEN" are set as described above, it becomes possible to express "0"-fixation of the input terminal at the logical level, "1"-fixation at the logical level and a special connecting state of the output terminal such as an open state on the semiconductor circuit connection data base of a table form.

Figure 5:
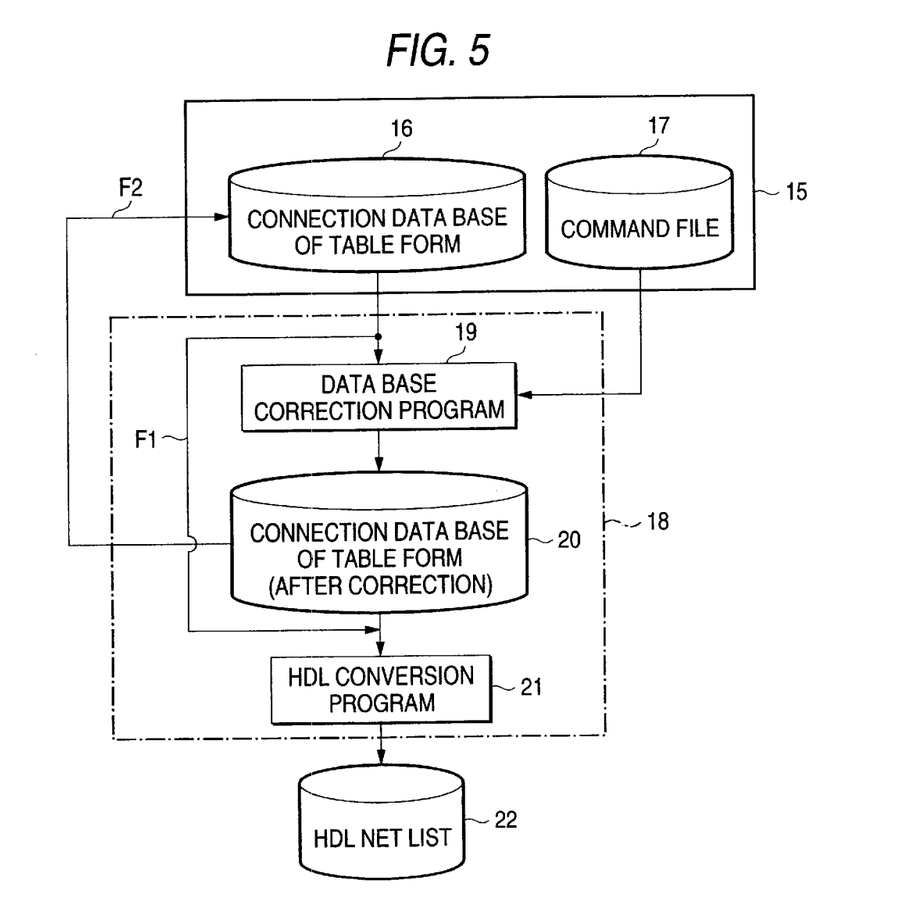
FIG. 5 is a flow chart showing a method of designing a semiconductor circuit using a semiconductor circuit connection data base of an embodiment of the present invention.

FIG. 5 is a flow chart showing a method of designing a semiconductor circuit using a semiconductor circuit connection data base of a table form of an embodiment of the present invention. In this flow chart, reference 15 is an object to be designed which is manually built by a worker, and reference 18 is automatic programming which is automatically built.

In FIG. 5, reference 16 is a semiconductor circuit connection data base of a table form according to the present invention, reference 17 is a design correction command file for correcting the semiconductor circuit connection data base, reference 19 is a data base correction program for automatically correcting the semiconductor circuit connection data base according to a command of the design correction command file 17, reference 20 is a semiconductor circuit connection data base which has been corrected by the data base correction program 19, reference 21 is an HDL conversion program for automatically creating an HDL net list from the semiconductor circuit connection data base at the final stage, and reference 22 is an HDL net list created by the HDL conversion program 21.

In the case where data base correction is not conducted on the semiconductor circuit connection data base 16 and it is directly converted into an HDL net list, data is directly inputted into the HDL conversion program via F1 so as to create the HDL net list 22. In the case where recorrection is conducted on the semiconductor circuit data base 20 which has already been corrected, the semiconductor circuit data base 20 which has already been corrected is treated as a semiconductor circuit data base 16 via the passage of F2, and the recorrection is conducted according to the flow chart.

As described above, the semiconductor circuit connection data base of the table form of the present invention is manually built and the design correction command file for correcting it is manually designed. After that, the data base is automatically corrected, and the conversion to the HDL net list is automatically conducted. Due to the foregoing, it is possible to realize a highly efficient semiconductor circuit design method of high quality.

Figure 6:
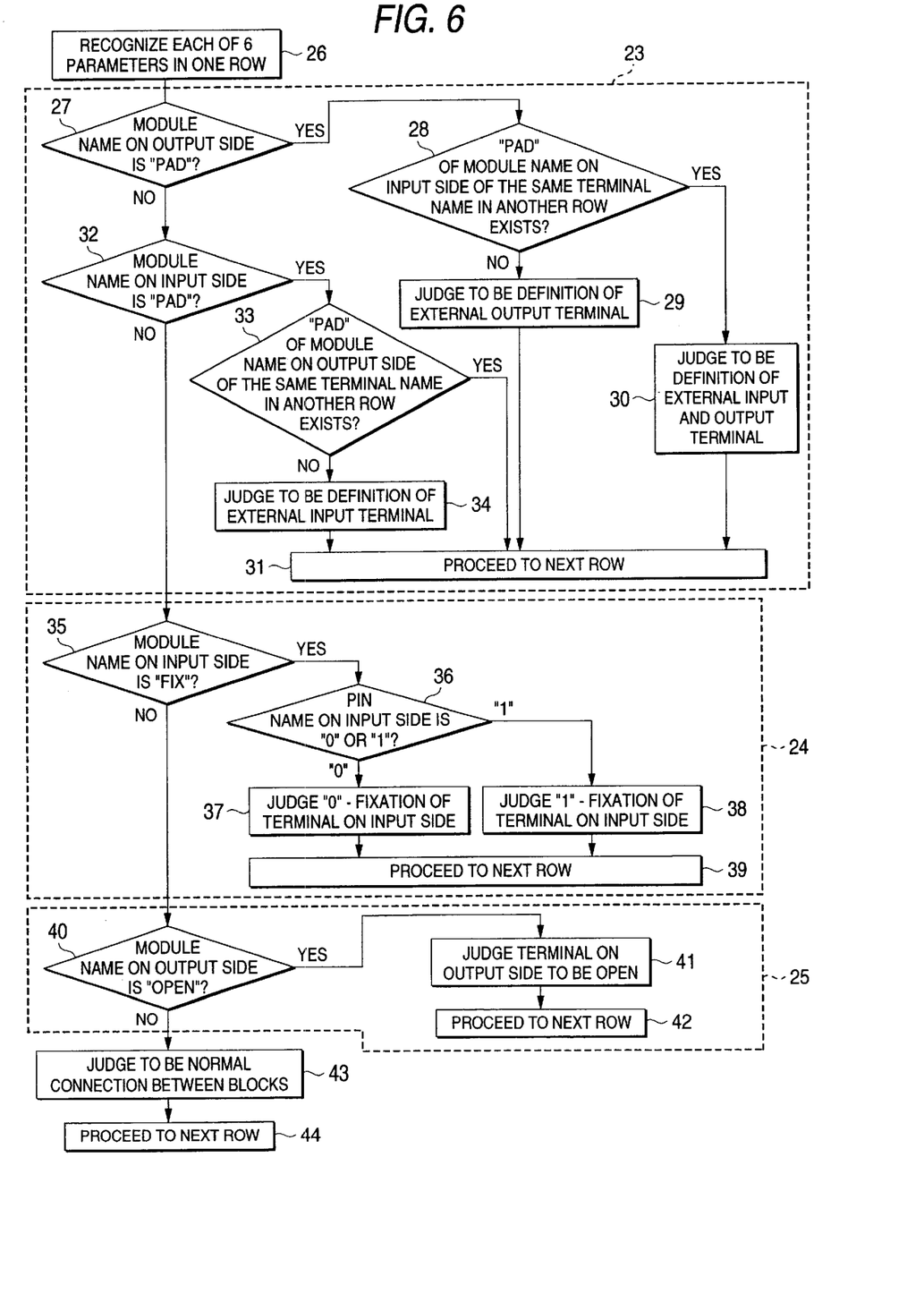
FIG. 6 is a flow chart for automatically recognizing a special identifier in a method of designing a semiconductor circuit using a semiconductor circuit connection data base of an embodiment of the present invention.

FIG. 6 is a flow chart for automatically recognizing the identifiers "PAD", "FIX" and "OPEN" to be respectively an external input and output terminal, a "0"-fixation or "1"-fixation at the logical level of the input terminal and an open state of the output terminal in the method of designing a semiconductor circuit in which the semiconductor circuit connection data base of the table form of the present invention explained in FIG. 5 is used. Due to the foregoing, it is possible to recognize the connection information necessary for outputting the HDL net list at the final stage.

In FIG. 6, the block 23 is a flow to recognize the definition of the external input and output terminal by the identifier "PAD", the block 24 is a flow to recognize the "0"-fixation or the "1"-fixation at the logical level of the input terminal by the identifier "FIX", and the block 25 is a flow to recognize the open state of the output terminal by the identifier "OPEN".

First, in step 26, with respect to the selected row to be processed, each of one set of six parameters is recognized. Next, the program proceeds to the block 23, and the definition of the external input and output terminal is recognized. In step 27, it is judged whether or not the output side module name is "PAD". When the output side module name is "PAD", the program proceeds to step 28. When the output side module name is not "PAD", the program proceeds to step 32.

In step 28, searching is conducted on all other rows so as to check whether or not a row exists, the input side module name of which is "PAD" and the output side terminal name of which is the same as the output side terminal name of the row to be processed presently. In the case of no existence, the program proceeds to step 29, and the terminal name described on the output side of this row is recognized to be the definition of the external output terminal, and the program proceeds to step 31 and the next row is processed. In the case of existence in step 28, the program proceeds to step 30, and the terminal name described on the output side of this row is recognized to be the definition of the external input and output terminal of the bidirection, and the program proceeds to step 31 and the next row is processed.

In step 32, it is judged whether or not the input module name is "PAD". When the input module name is "PAD", the program proceeds to step 33, and when the input module name is not "PAD", the program proceeds to step 35 in the block 24. In step 33, searching is conducted on all other rows so as to check whether or not a row exists, the output side module name of which is "PAD" and the input side terminal name of which is the same as the input side terminal name of the row to be processed presently. In the case of no existence, the program proceeds to step 34, and the terminal name described on the input side of this row is recognized to be the definition of the external input terminal, and the program proceeds to step 31 and the next row is processed. In the case of existence in step 33, the processing of the present row is skipped, and the program proceeds to step 31 as it is and the next row is processed.

Next, in the block 24, with respect to the input terminal, the recognition of the "0"-fixation or the "1"-fixation at the logical level is conducted. In step 35, it is recognized whether or not the input model name is "FIX". When the input model name is "FIX", the program proceeds to step 36, and when the input model name is not "FIX", the program proceeds to step 40. In step 36, it is judged whether the terminal name on the input side is "0" or "1". When the terminal name is "1", the program proceeds to step 38. After it has been judged that the input side is the "1"-fixation at the logical level, the program proceeds to step 39 and the next row is processed. When the terminal name on the output side is "0", the program proceeds to step 37. After it has been judged that the input side is the "0"-fixation at the logical level, the program proceeds to step 39 and the next row is processed.

Next, in the block 25, the open state of the output terminal is recognized. In step 40, it is judged whether or not the module name on the input side is "OPEN". When the module name on the input side is "OPEN", the program proceeds to step 41. After the open state of the terminal on the output side has been judged, the program proceeds to step 42 and the next row is processed. When the module name on the input side is not "OPEN", the program proceeds to step 43.

In the case where the program reaches step 43, it is judged that the identifiers, which mean special terminal information such as "PAD", "FIX" and "OPEN", have not been found, and it is judged that the presently processed row is a normal connection of the terminal on the output side with the terminal on the input side. Therefore, the program proceeds to step 44, and the next row is processed.

When the definition of the special terminal corresponding to the identifier in the semiconductor circuit connection data base of the table form of the present invention is recognized according to the flow chart, it is possible to obtain information sufficient for creating the HDL net list in the HDL conversion program 21 in FIG. 5. In FIG. 6, the order of processing the blocks 23, 24 and 25 is not particularly restricted.

Figure 7:
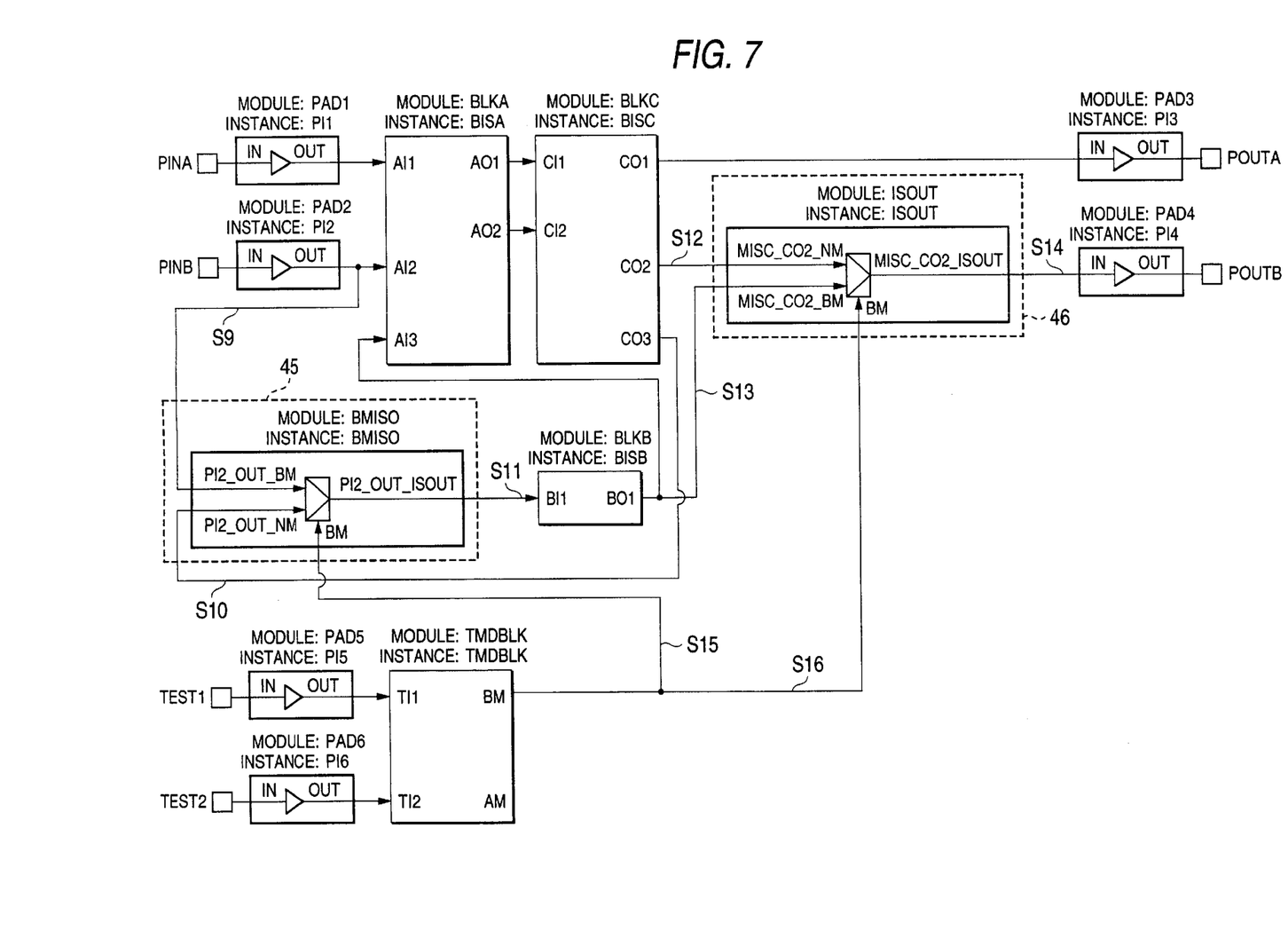
FIG. 7 is a view showing a circuit to be corrected in a method of designing a semiconductor circuit of the present invention.
Figure 8:
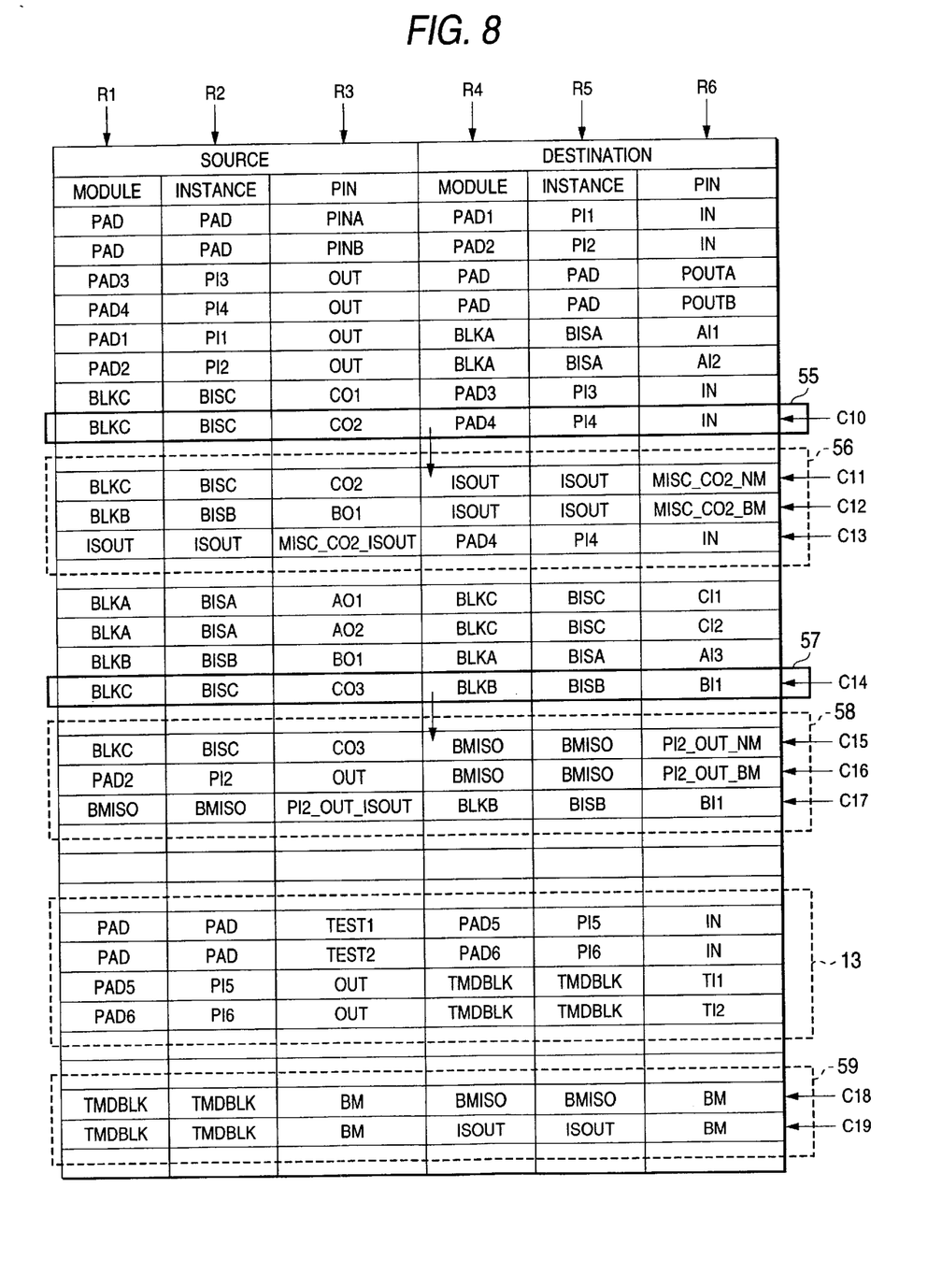
FIG. 8 is a view showing a semiconductor circuit connection data base of the present invention in which a circuit to be corrected is expressed.

FIGS. 7 and 8 are views showing a method of correction for correcting a semiconductor circuit connection data base by a data base correction program in the method of designing a semiconductor circuit of an embodiment of the present invention. FIG. 7 is a view showing a method of correction in which the selectors 45, 46 are respectively inserted into the nets S8, S7 in the circuit shown in FIG. 1. Insertion of the selectors 45, 46 is designated by the design correction command file 17 shown in FIG. 5. FIG. 8 is a view showing a method of correction applied to the semiconductor circuit connection data base in FIG. 2 according to this designation.

Insertion of the selectors 45, 46 shown in FIG. 7 is equal to a change in the portion 55 to the portion 56, a change in the portion 57 to the portion 58 and an addition of the portion 59 in the semiconductor circuit connection data base in FIG. 8. First, a correction in which the portion 55 is changed to the portion 56 in FIG. 8 is equal to that the net S8 in FIG. 1 is converted into the nets S9, S10, S11 in the case of inserting the selector 45 in FIG. 7. Lines in the semiconductor circuit connection data base in FIG. 8 corresponding to the nets S9, S10, S11 are respectively C11, C12, C13.

Next, a correction in which the portion 57 is changed to the portion 58 in FIG. 8 is equal to that the net S7 in FIG. 1 is converted into the nets S12, S13, S14 in the case of inserting the selector 46 in FIG. 7. Lines in the semiconductor circuit connection data base in FIG. 8 corresponding to the nets S12, S13, S14 are respectively C15, C16, C17.

Finally, when the control signal of the selector, that is, the row corresponding to the nets S15, S16 in FIG. 7 is added to the portion 59 in FIG. 8, that is, C18, C19, the correction is completed.

As described above, when the semiconductor circuit connection data base of the table form of the present invention is used, in the case of inserting a block and changing a connection in the existing design, it is possible to conduct corrections on the row data without using the concept of the net and without being restricted by the order. Therefore, the work can be easily automated and the complication of the work can be avoided.

As explained above, according to the present invention, when a connection relation between the functional blocks forming the internal circuit of a semiconductor device is expressed by a semiconductor circuit connection data base of a table form, information about a connection relation between the functional blocks can be concentrated upon one set of row data. Therefore, the connection relation can be easily recognized. Since the concept of the net is not used, complication can be avoided when the semiconductor circuit connection data base is built or the design is changed.

Further, according to the present invention, in the semiconductor circuit connection data base, when the definition of the external input and output terminal, the fixation of the input terminal at the logical level and the special state of the terminal such as opening the output terminal are described using the predetermined identifiers, they can be recognized by a program and automatically processed.

Further, according to the present invention, with respect to this semiconductor circuit connection data base, the circuit is corrected by the data base correction program while using the design correction command file, and the net name is automatically given by the HDL conversion program at the final stage and the HDL net list is outputted. Due to the foregoing, the occurrence of man-made errors can be suppressed and the design efficiency can be enhanced.

What is claimed is:

1. A semiconductor circuit connection data base expressing a relation of connection between functional blocks forming an internal circuit of a semiconductor device, wherein the relation of a connection between the functional blocks is described in a form of a table on which a functional block on the output side and a name of a terminal on the output side, and a functional block on the input side and a name of a terminal on the input side are made into a set of row data, without using a name of a net, wherein the terminal of the functional block, described by the functional block on the input side and the name of the terminal on the input side, is a terminal of "0"-fixation or "1"-fixation at the logical level when at least one of the functional blocks on the output side and the name of the terminal on the output side is a specific identifier.

2. A semiconductor circuit connection data base expressing a relation of connection between functional blocks forming an internal circuit of a semiconductor device, wherein the relation of a connection between the functional blocks is described in a form of a table on which a functional block on the output side and a name of a terminal on the output side, and a functional block on the input side and a name of a terminal on the input side are made into a set of row data, without using a name of a net, wherein the terminal of the functional block, described by the functional block on the input side and the name of the terminal on the output side, is a terminal in an open state when at least one of the functional blocks on the input side and the name of the terminal on the input side is a specific identifier.

3. A semiconductor circuit connection data base expressing a relation of connection between functional blocks forming an internal circuit of a semiconductor device, wherein the relation of a connection between the functional blocks is described in a form of a table on which a functional block on the output side and a name of a terminal on the output side, and a functional block on the input side and a name of a terminal on the input side are made into a set of row data, without using a name of a net, wherein the terminal described by the terminal name on the input side is expressed to be an output terminal to the outside of the semiconductor device when the functional block on the input side is made to be a specific identifier.

4. A semiconductor circuit connection data base expressing a relation of connection between functional blocks forming an internal circuit of a semiconductor device, wherein the relation of a connection between the functional blocks is described in a form of a table on which a functional block on the output side and a name of a terminal on the output side, and a functional block on the input side and a name of a terminal on the input side are made into a set of row data, without using a name of a net, wherein the terminal described by the terminal name on the output side is expressed to be an input terminal from the outside of the semiconductor device when the functional block on the output side is made to be a specific identifier.

5. A semiconductor circuit connection data base expressing a relation of connection between functional blocks forming an internal circuit of a semiconductor device, wherein the relation of a connection between the functional blocks is described in a form of a table on which a functional block on the output side and a name of a terminal on the output side, and a functional block on the input side and a name of a terminal on the input side are made into a set of row data, without using a name of a net, wherein when a terminal expressed to be an input terminal from the outside of a semiconductor device in one row data by the data base and a terminal expressed to be an output terminal to the outside of the semiconductor device in the other row data by the data base are of the same terminal name, it is expressed that the terminal having the same terminal name is a bi-directional terminal of input and output with respect to the outside of the semiconductor device.

6. A method of designing a semiconductor circuit using a semiconductor circuit connection data base expressing a relation of connection between functional blocks forming an internal circuit of a semiconductor device, wherein the relation of a connection between the functional blocks is described in a form of a table on which a functional block on the output side and a name of a terminal on the output side, and a functional block on the input side and a name of a terminal on the input side are made into a set of row data, without using a name of a net, said method comprising a step of:

automatically giving a net name by an HDL conversion program so that an HDL net list is created according to the functional block on the output side and the terminal name on the output side and also according to the functional block on the input side and the terminal name on the input side.

7. A recording medium for recording a program for an HDL conversion program that executes the method according to claim 6.

* * * * *